United States Patent
Plat et al.

(10) Patent No.: US 6,900,002 B1
(45) Date of Patent: May 31, 2005

(54) ANTIREFLECTIVE BI-LAYER HARDMASK INCLUDING A DENSIFIED AMORPHOUS CARBON LAYER

(75) Inventors: Marina V. Plat, San Jose, CA (US); Marilyn I. Wright, Sunnyvale, CA (US); Lu You, San Jose, CA (US); Scott A. Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 10/299,427

(22) Filed: Nov. 19, 2002

(51) Int. Cl.[7] .................................................. G03F 7/00
(52) U.S. Cl. ...................... 430/328; 430/296; 430/311; 430/313; 430/322; 430/323; 430/330; 427/372.2
(58) Field of Search ................................ 430/296, 311, 430/313, 322, 323, 328, 330; 427/372.2

(56) References Cited

U.S. PATENT DOCUMENTS

| | | | |
|---|---|---|---|
| 5,767,018 A | * 6/1998 | Bell | ........................ 438/696 |
| 6,103,305 A | * 8/2000 | Friedmann et al. | ....... 427/249.7 |
| 6,500,756 B1 | * 12/2002 | Bell et al. | .................... 438/639 |
| 6,653,735 B1 | * 11/2003 | Yang et al. | ................. 257/758 |
| 6,670,045 B1 | * 12/2003 | Gillich et al. | ............... 428/469 |
| 2003/0232495 A1 | * 12/2003 | Moghadam et al. | ........ 438/623 |

FOREIGN PATENT DOCUMENTS

| | | | | |
|---|---|---|---|---|
| EP | 1154468 | * 11/2001 | ......... | H01L/21/314 |
| JP | 6-333916 | * 12/1994 | ......... | H01L/21/314 |

* cited by examiner

*Primary Examiner*—Mark F. Huff
*Assistant Examiner*—Nicole Barreca
(74) *Attorney, Agent, or Firm*—Foley & Lardner LLP

(57) ABSTRACT

An amorphous carbon layer of an antireflective bi-layer hardmask is processed to increase its density prior to patterning of an underlying polysilicon layer using the bi-layer hardmask. The increased density of the layer increases its resistance to polysilicon etch chemistry, thus reducing the likelihood of patterning inaccuracies resulting from amorphous carbon depletion during polysilicon etch, and enabling the patterning of thicker polysilicon layers than can be reliably patterned without densification. The increased density also reduces stresses, thus reducing the likelihood of delamination. Densification may be performed by UV or e-beam irradiation after formation of an overlying protective layer. Densification may also be performed by annealing the amorphous carbon layer in situ prior to formation of the overlying protective layer. In the latter case, annealing reduces the amount of outgassing that occurs during formation of the protective layer, thus reducing the formation of pin holes.

7 Claims, 5 Drawing Sheets

ANTIREFLECTIVE BI-LAYER HARDMASK INCLUDING A DENSIFIED AMORPHOUS CARBON LAYER

BACKGROUND OF THE INVENTION

1. Field of the Invention

The invention pertains to fabrication of semiconductor devices, and in particular to fabrication techniques using an antireflective bi-layer hardmask for etching polysilicon.

2. Related Technology

An emphasis on increased semiconductor device performance has led to investigation of ways to increase device speed. One way of increasing device speed is to reduce the size of individual circuit components and the wiring that connects them. This enables circuit components to operate faster and to be placed closer together, and enables more circuit components to be used in a given device.

A recently developed technique uses an antireflective bi-layer hardmask structure as shown in FIG. 1 for patterning narrow polysilicon features. In FIG. 1, a substrate 10 has formed thereon a silicon oxide gate insulating layer 12 and a polysilicon gate conductive layer 14 that are to be patterned to form a gate line and gate insulator. A bi-layer hardmask structure including an amorphous carbon layer 16 and a protective layer 18 such as silicon nitride, silicon oxynitride or silicon oxide is formed over the polysilicon layer 14. A photoresist mask 20 is formed on the protective layer 18. The photoresist mask 20 is used to pattern a first hardmask from the protective layer 18, which in turn is used to pattern a second hardmask from the amorphous carbon layer 16, which in turn is used to pattern the polysilicon layer 14.

The bi-layer hardmask structure of FIG. 1 has a number of advantages. One advantage is that the bi-layer hardmask serves as an antireflective coating (ARC) when the amorphous carbon layer 16 is formed to a thickness of approximately 200–1000 angstroms and the protective layer is formed to a thickness of approximately 100–500 angstroms. This enables accurate patterning of overlying photoresist down to the minimum feature size achievable through the projection lithography technique being used. A second advantage of the bi-layer hardmask using amorphous carbon is that the photoresist mask and the first and second hardmasks may each be subjected to a trimming process whereby a portion of the mask is consumed by an isotropic etching plasma, thus narrowing the width of each mask. Such a sequential reduction of mask sizes enables the patterning of polysilicon features having feature sizes that are significantly smaller than the smallest feature size that can be created in the initial photoresist mask. A further advantage of the antireflective bi-layer hardmask is that the remaining hardmask materials can be selectively removed from the final patterned structure by ashing the amorphous carbon layer in an ashing atmosphere such as an isotropic oxygen or hydrogen plasma, which removes the amorphous carbon and detaches any remaining overlying material without damaging the underlying polygate structure and gate oxide.

Despite these advantages, other aspects of the antireflective bi-layer hardmask of FIG. 1 present obstacles to accurate pattern transfer. One obstacle is that the chlorine or HBr etch chemistry used to pattern polysilicon consumes amorphous carbon at a relatively high rate. The selectivity rate for amorphous carbon relative to polysilicon is approximately 1:3. Therefore, given the need to use an amorphous carbon thickness of approximately 500 angstroms in order to achieve antireflective properties, a maximum of approximately 1500 angstroms of polysilicon may be etched using a 500 angstrom amorphous carbon hardmask before so much of the amorphous carbon is consumed that pattern transfer accuracy is degraded. This problem is illustrated in FIGS. 2a–2b. FIG. 2a shows an amorphous carbon hardmask 22 having a thickness of approximately 500 angstroms that is formed on a polysilicon layer 14 having a thickness of approximately 2000 angstroms. As shown in FIG. 2b, by the time the polysilicon has been completely etched to form a polysilicon gate 24, the material of the amorphous carbon hardmask 22 is nearly depleted, causing its width to significantly narrow and thus producing a tapered profile in the polysilicon gate 24. In some instances, the loss of amorphous carbon may result in a gate that is too thin, causing a pattern collapse. If the amorphous carbon is consumed completely, then detrimental effects including top rounding, line edge roughness and a reduction in the height of the gate line will result. Since the amorphous carbon layer thickness may vary across the substrate topography, such inaccuracies are likely to occur at thinner portions of the amorphous carbon layer. Another obstacle presented by the antireflective bi-layer hardmask involves poor adherence of amorphous carbon to other materials and differences in the mechanical properties of amorphous carbon and polysilicon. In practice, the internal compressive forces generated within the amorphous carbon are contained so long as the overlying protective material is present. However, when the overlying protective layer is removed during patterning of a narrow line, the remaining adhesive forces between the polysilicon and amorphous carbon, which are relatively weak, may not be sufficient to contain the expansion forces of the amorphous carbon. In the instances where the length of the amorphous carbon line is much larger then its width, the amorphous carbon hardmask expands and delaminates from the polysilicon, causing lengthening where delamination occurs. Thus the expansion of the amorphous carbon degrades pattern transfer accuracy and must therefore be avoided A third obstacle presented by the antireflective bi-layer hardmask structure of FIG. 1 is photoresist poisoning and premature amorphous carbon etching. Protective layer materials such as silicon nitride and silicon oxynitride generally contain "pin holes." The pin holes are believed to be formed during protective layer deposition by outgassing from the amorphous carbon or incomplete coverage of nucleation sites. During photoresist application, the pin holes in the protective layer provide a path for "poisoning" of undeveloped photoresist by contaminants from the amorphous carbon layer such as nitrogen or other dopants that may be used to enhance etch selectivity. Contaminated photoresist may not react appropriately with developer chemistry, resulting in photoresist pattern abnormalities that will be transferred to underlying layers during later processing. Further, the pinholes enable photoresist developer and rework chemistry to attack the amorphous carbon, producing amorphous carbon pattern abnormalities.

SUMMARY OF THE INVENTION

In view of the aforementioned problems of the background technology, there is a need for additional techniques to improve the pattern transfer accuracy of antireflective bi-layer hardmasks.

In accordance with a preferred embodiment of the invention, an amorphous carbon layer of a bi-layer hardmask is processed to increase its density prior to patterning of an underlying polysilicon layer. The increased density of the amorphous carbon layer increases its resistance to polysilicon etch chemistry, thus reducing the likelihood of patterning inaccuracies resulting from amorphous carbon depletion, and enabling the patterning of thicker polysilicon layers than can be reliably patterned using the background technology. The increased density also reduces internal stress in the amorphous carbon film, thus reducing the likelihood of delamination and reducing outgassing from the amorphous carbon layer In one preferred embodiment, densification is performed by UV or e-beam irradiation after formation of an overlying protective layer. In another preferred embodiment, densification is performed by annealing the amorphous carbon layer in situ prior to formation of the overlying protective layer. In the latter case, annealing significantly reduces the amount of outgassing that occurs during subsequent formation of the protective layer, thus reducing the formation of pin holes in the protective layer.

In accordance with one embodiment of the invention, densification is performed during manufacture of a semiconductor device. Initially a substrate having a polysilicon layer formed thereon is provided. An antireflective bi-layer hardmask is formed on the polysilicon layer. The bi-layer hardmask is comprised of an amorphous carbon layer formed on the polysilicon layer and a protective layer formed on the amorphous carbon layer. The polysilicon layer is patterned using the antireflective bi-layer hardmask at an etch mask. Prior to patterning of the polysilicon layer, the amorphous carbon layer of the bi-layer hardmask is processed to densify the amorphous carbon so as to increase the resistance of the amorphous carbon to etch chemistry used to pattern the polysilicon layer. Densification may be achieved by UV irradiation, e-beam irradiation, or annealing.

DETAILED DESCRIPTION OF PREFERRED EMBODIMENTS

First Embodiment

Figure 1:
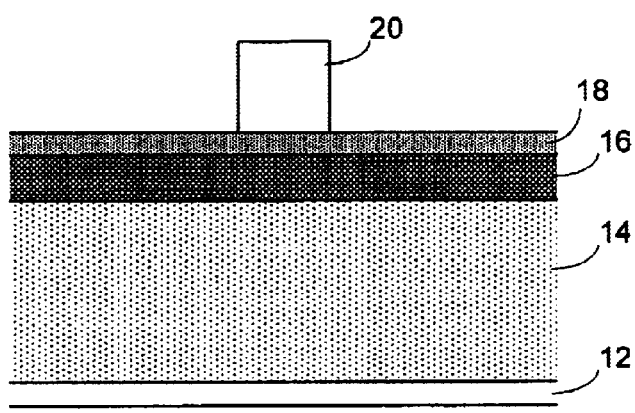
FIG. 1 shows a conventional structure including a bi-layer hardmask structure.
Figure 2A:
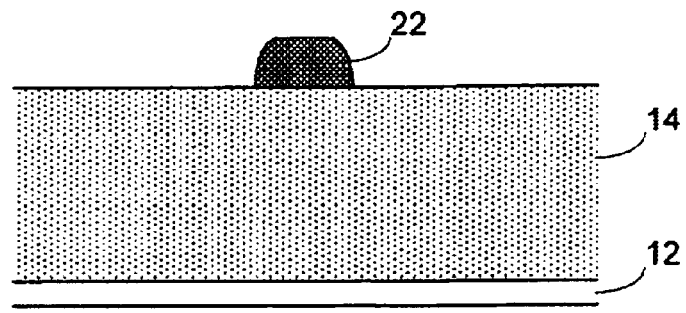
FIGS. 2a and 2b show a mechanism that produces pattern inaccuracy when using an amorphous carbon hardmask.
Figure 2B:
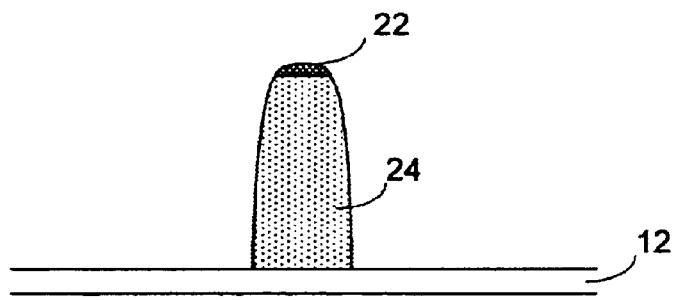
Figure 3A:
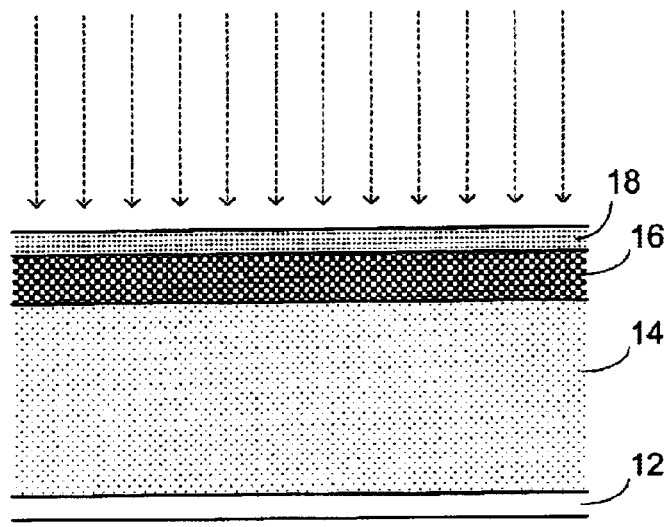
FIGS. 3a and 3b show structures formed during processing in accordance with a first preferred embodiment.
Figure 3B:
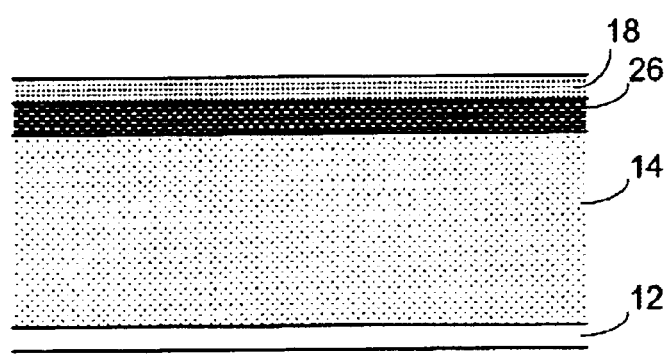

FIGS. 3a and 3b show structures formed during processing in accordance with a first preferred embodiment of the invention in which an amorphous carbon layer of an antireflective bi-layer hardmask is densified through irradiation such as by an ultraviolet (UV) radiation source or an electron beam (e-beam). As shown in FIG. 3a, an amorphous carbon layer 16 is exposed to irradiation after a protective layer 18 of the bi-layer antireflective hardmask is formed over the amorphous carbon layer 16. As shown in FIG. 3b, the result of irradiation is a densified amorphous carbon layer 26 that exhibits increased resistance to polysilicon etch chemistry.

Irradiation is performed in a UV hardening tool. The substrate having the amorphous carbon layer is preferably placed on the hot plate of the UV hardening tool and subjected to a temperature ramp from 25 degrees C. to 250 degrees C. UV irradiation is performed during the temperature ramp, which typically takes approximately 1–3 minutes. The temperature is then allowed to ramp down to room temperature.

The UV irradiation as described above produces a densification on the order of 200–500 angstroms for an amorphous carbon layer having an initial thickness of approximately 1000 angstroms. The etch selectivity of the densified amorphous carbon layer to polysilicon is 1:4, compared to a selectivity of 1:3 for undensified amorphous carbon. The optical properties of the amorphous carbon layer do not change, and therefore it is not necessary to compensate for changes due to densification when designing the bi-layer hardmask to provide optimal antireflective properties.

Where e-beam densification is employed, it is preferable to use a dose in the range of 400 to 2400 $\mu C/cm^2$. An acceleration voltage is chosen to match the film thickness, and is generally in the range of from 2–10 KeV. The electron current is preferably in the range of 10–20 mAmp to maximize throughput. The typical densification of a 1000 angstrom amorphous carbon layer subjected to e-beam treatment is approximately 300–500 angstroms.

Second Embodiment

Figure 4A:
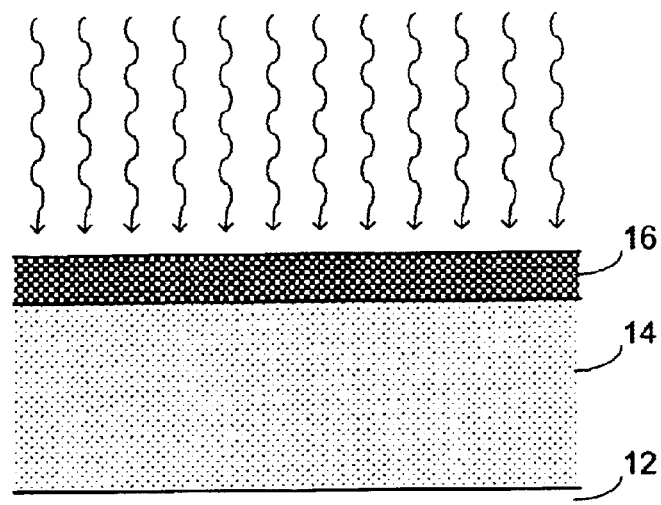
FIGS. 4 and 4b shows structures formed during processing in accordance with a second preferred embodiment.
Figure 4B:
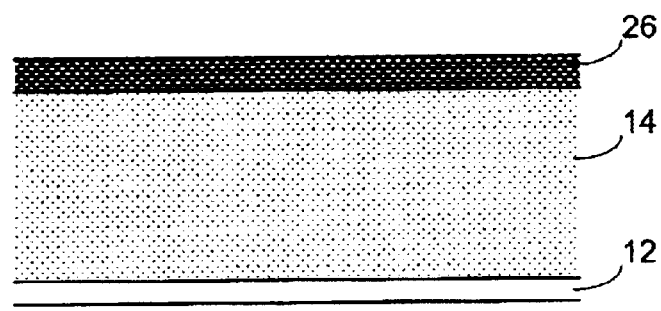

FIGS. 4a and 4b show structures formed during processing in accordance with a second preferred embodiment of the invention in which an amorphous carbon layer of a bi-layer antireflective hardmask is densified through annealing. As shown in FIG. 4a, an amorphous carbon layer 16 is preferably annealed in situ after its deposition and prior to formation of an overlying protective layer, although annealing could also be performed outside the deposition chamber. Annealing is typically performed at a temperature of 300 to 700 degrees C. in a vacuum for one to fifteen minutes. The resulting structure shown in FIG. 4b comprises a densified amorphous carbon layer 26 that exhibits increased resistance to polysilicon etch chemistry.

The annealing performed in the second preferred embodiment densities the amorphous carbon film, relaxes compressive stress in the amorphous carbon film that can lead to delamination, and causes outgassing from the amorphous carbon which reduces the amount of outgassing that occurs later during deposition of the overlying protective layer. As a result the amorphous carbon film has lower stress, and the overlying protective layer has a lower pinhole density, thus reducing the problems associated with resist poisoning.

Alternatives to the aforementioned processing may also be implemented. For example, the amorphous carbon layer may be irradiated with UV energy or with an e-beam prior to formation of the protective layer. However, since such irradiation must typically be done ex situ, such processing may introduce unwarranted complexity. Similarly, the amorphous carbon may be annealed after formation of a protective layer, however this does not produce the beneficial outgassing of the amorphous carbon layer prior to protective layer formation, and therefore does not reduce pinholes and may reduce the amount of densification that can be obtained. The irradiation and annealing techniques may also be employed together.

The enhanced antireflective bi-layer hardmask may be employed in a variety of implementations for patterning polysilicon, including formation of gate lines, formation of polysilicon wiring, patterning of narrow spaces within a polysilicon layer, and other polysilicon patterning applications. Such patterning is characterized by sequential patterning of the upper protective layer using a photoresist mask or other mask as an etch mask, followed by patterning of the amorphous carbon layer using the protective layer as an etch mask, followed by patterning of the polysilicon using the amorphous carbon as an etch mask. Remaining amorphous carbon is then typically stripped by ashing remove the amorphous carbon and any remaining portion of the overlying hardmask layer. In the case of MOSFET or CMOS production, this may be followed by patterning of a self-aligned gate insulator, formation of shallow source and drain extensions, formation of gate spacers, formation of deep source and drain regions, and formation of source and drain suicides. In other applications, polysilicon patterning may be followed by inlaying of dielectric material in spaces patterned in the polysilicon layer, or formation of an interlevel dielectric around the patterned polysilicon.

Figure 5:
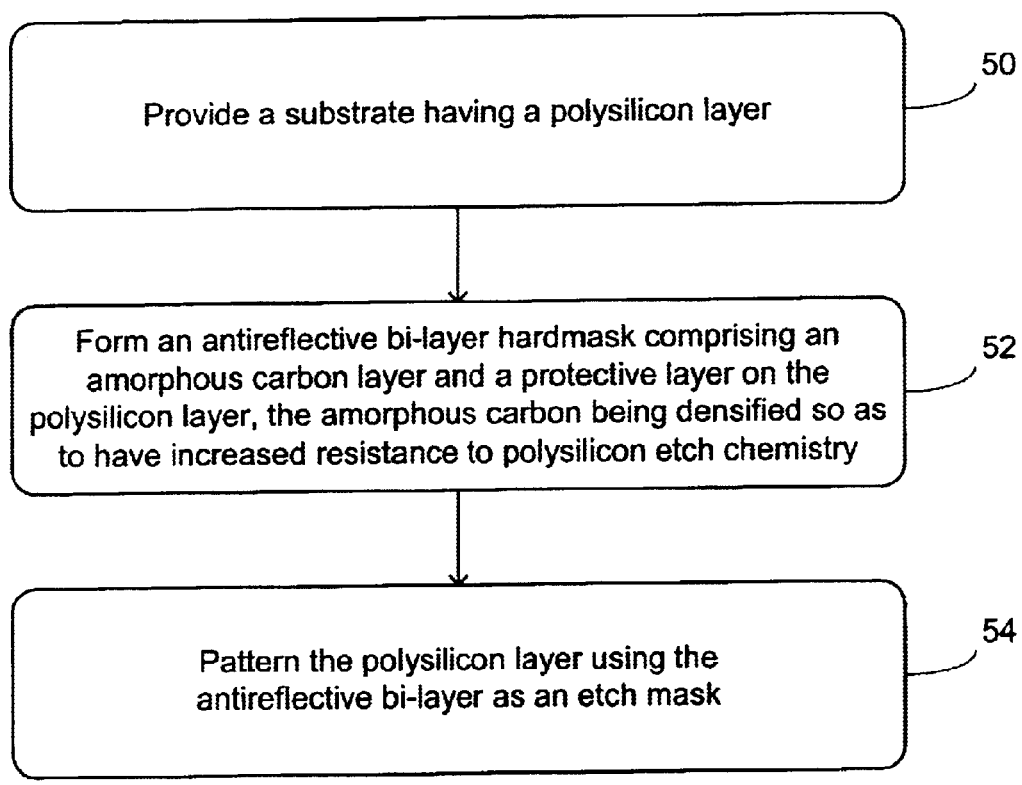
FIG. 5 shows a process flow encompassing the first and second preferred embodiments and alternative embodiments.

FIG. 5 shows a process flow for manufacture of a semiconductor device that encompasses the first and second preferred embodiment, the aforementioned alternative implementations, and other alternative implementations. Initially a substrate is provided (50). The substrate has a polysilicon layer formed thereon. An antireflective bi-layer hardmask comprising an amorphous carbon layer and a protective layer is then formed on the polysilicon layer (52). The amorphous carbon layer is processed to densify the amorphous carbon so as to increase its resistance to polysilicon etch chemistry such as chlorine or HBr. This processing may involve irradiating the amorphous carbon layer with UV radiation or an e-beam, or involve annealing the amorphous carbon layer, or both, or the use of alternative densification processing. The polysilicon layer is then patterned using the antireflective bi-layer hardmask at an etch mask (54). This involves sequential patterning of each of the hardmask layers, and may include trimming of the pattern formed in each layer as well as trimming of a photoresist mask or other mask used to pattern the protective layer. Subsequent to patterning of the polysilicon layer, remaining amorphous carbon may be stripped by ashing to remove the amorphous carbon and any remaining portion of the overlying hardmask layer. In the case of MOSFET or CMOS production, this may be followed by patterning of a self-aligned gate insulator, formation of shallow source and drain extensions, formation of gate spacers, formation of deep source and drain regions, and formation of source and drain silicides. In other applications, polysilicon patterning may be followed by inlaying of dielectric material in spaces patterned in the polysilicon layer, or deposition of an interlevel dielectric around the patterned polysilicon.

It may be further desirable to perform additional processing during amorphous carbon deposition to further enhance the amorphous carbon density. For example, a bias condition may be introduced during plasma enhanced chemical vapor deposition of amorphous carbon to accelerate the amorphous carbon toward the substrate so that the deposited amorphous carbon is tightly packed and therefore enhanced in its density. Additional adjustments of processing parameters such as increased temperature and increased pressure may further densify the deposited amorphous carbon.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A process performed during manufacture of a semiconductor device, comprising:
   providing a substrate having a polysilicon layer formed thereon;
   forming an amorphous carbon layer on the polysilicon layer;
   forming a protective layer on the amorphous carbon layer to form an antireflective bi-layer hardmask comprised of the amorphous carbon layer and the protective layer;
   irradiating the amorphous carbon layer with UV radiation after forming the protective layer over the amorphous carbon layer to densify the amorphous carbon so as to increase the resistance of the amorphous carbon to etch chemistry used to pattern the polysilicon layer; and
   patterning the polysilicon layer using the antireflective bi-layer hardmask as an etch mask.

2. The process claimed in claim 1, wherein the etch chemistry includes at least one of chlorine and HBr.

3. The process claimed in claim 1, wherein said UV irradiation is performed during ramping of the temperature of the substrate from approximately 25 degrees C. to approximately 250 degrees C.

4. The process claimed in claim 1, wherein said processing further comprises annealing the amorphous carbon prior to formation of the protective layer over the amorphous carbon layer.

5. The process claimed in claim 4, wherein said annealing is performed in situ at a temperature in the range of 300 to 700 degrees C. in a vacuum for one to fifteen minutes.

6. The process claimed in claim 1, wherein patterning the polysilicon layer comprises sequentially patterning the protective layer, the amorphous carbon layer, and the polysilicon layer.

7. The process claimed in claim 6, wherein at least one of a photoresist mask used to pattern the protective layer, a protective layer hardmask used to pattern the amorphous carbon layer, and an amorphous carbon hardmask used to pattern the polysilicon layer is trimmed prior to its use for patterning an underlying layer.

* * * * *

UNITED STATES PATENT AND TRADEMARK OFFICE
CERTIFICATE OF CORRECTION

PATENT NO.    : 6,900,002 B1
DATED         : May 31, 2005
INVENTOR(S)   : Harrison et al.

It is certified that error appears in the above-identified patent and that said Letters Patent is hereby corrected as shown below:

Column 4,
Line 59, delete "selecting" and insert -- selectins --.

Column 5,
Line 2, delete "selecting" and insert -- selectins --.

Signed and Sealed this

Thirty-first Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,900,002 B1  Page 1 of 1
DATED : May 31, 2005
INVENTOR(S) : Marina V. Plat et al.

It is certified that error appears in the above-identified patent and that said Letters Patent is hereby corrected as shown below:

This certificate supersedes certificate of correction issued January 31, 2006, the number was erroneously mentioned and should be vacated since no certificate of correction was granted for this patent number.

Signed and Sealed this

Twenty-eighth Day of February, 2006

JON W. DUDAS
*Director of the United States Patent and Trademark Office*